United States Patent
Kawai

(10) Patent No.: US 8,395,445 B2
(45) Date of Patent: Mar. 12, 2013

(54) POWER AMPLIFIER, NON-LINEAR DISTORTION CORRECTING METHOD OF POWER AMPLIFIER AND RADIO COMMUNICATION DEVICE

(75) Inventor: Masahiro Kawai, Tokyo (JP)

(73) Assignee: NEC Corporation, Tokyo (JP)

( * ) Notice: Subject to any disclaimer, the term of this patent is extended or adjusted under 35 U.S.C. 154(b) by 89 days.

(21) Appl. No.: 13/003,791

(22) PCT Filed: Jun. 5, 2009

(86) PCT No.: PCT/JP2009/002541
§ 371 (c)(1),
(2), (4) Date: Jan. 12, 2011

(87) PCT Pub. No.: WO2010/007721
PCT Pub. Date: Jan. 21, 2010

(65) Prior Publication Data
US 2011/0121899 A1    May 26, 2011

(30) Foreign Application Priority Data
Jul. 15, 2008  (JP) .................................. 2008-183699

(51) Int. Cl.
*H03F 1/26* (2006.01)
(52) U.S. Cl. ........................................... 330/149
(58) Field of Classification Search .............. 330/136, 330/149; 375/296, 297; 455/114.3
See application file for complete search history.

(56) References Cited

U.S. PATENT DOCUMENTS
6,335,767 B1   1/2002  Twitchell et al.
6,751,266 B1*  6/2004  Danielsons .................... 375/296

FOREIGN PATENT DOCUMENTS
| JP | 6-69731 A | 3/1994 |
| JP | 11-239190 A | 8/1999 |
| JP | 2000069098 A | 3/2000 |
| JP | 2000201099 A | 7/2000 |
| JP | 2006279633 A | 10/2006 |
| JP | 2006345490 A | 12/2006 |
| WO | 03055056 A | 7/2003 |

OTHER PUBLICATIONS
Supplementary European Search Report for EP 09 79 7650 issued Dec. 29, 2011.
International Search Report for PCT/JP2009/002541 mailed Jul. 7, 2009.

* cited by examiner

Primary Examiner — Robert Pascal
Assistant Examiner — Khiem Nguyen

(57) ABSTRACT

The invention intends to supply a power amplifier enable to correct a distortion correctly by linearizer corresponding to each amplifier if plural amplifiers are used at any operation points. A power amplifier according to the invention includes a number of amplifiers connected with multiple stages and a number of linearizers connected with multiple stages and correcting non-linear distortions of the amplifiers. In the invention, a distortion in the amplifier of a former stage is corrected by the linearizer of a later stage.

14 Claims, 7 Drawing Sheets

INPUT-OUTPUT CHARACTERISTIC OF FIRST STAGE AMPLIFIER 4

INPUT-OUTPUT CHARACTERISTIC OF SECOND STAGE AMPLIFIER 6

POWER AMPLIFIER, NON-LINEAR DISTORTION CORRECTING METHOD OF POWER AMPLIFIER AND RADIO COMMUNICATION DEVICE

The present application is the National Phase of PCT/JP2009/002541, filed Jun. 5, 2009, which claims the benefit of priority and incorporation herein by reference in its entirely, the following Japanese Patent Application No. 2008-183699 filed on Jul. 15, 2008.

TECHNICAL FIELD

This invention relates to a power amplifier which amplifies a transmission signal at a transmitting unit of a radio communication device, and more particularly to a power amplifier, a non-linear distortion correcting method of the power amplifier and a radio communication device which have a function of correcting a non-linear distortion of an amplifier.

BACKGROUND ART

Further, there are various types of modulation methods used in transmitters of microwave digital fix radio communication devices. Some devices are configured to use some modulation methods by switching them. In this case, each modulation method has different standards of a spectrum mask for a transmitting output, and in general, low multiple values (QPSK, BPSK or the like) have a large acceptable value of the non-linear distortion and high multiple values (128 QAM, 256 QAM or the like) have a small acceptable value of it. That is, in the low multiple values, a large transmitting power can be obtained while allowing the distortion. But in the high multiple values, the large transmitting power cannot be obtained because of an influence of the distortion.

An adjustment of the output power is often performed by connecting plural amplifiers with multiple stages and changing an operating point of each amplifier in order to change a maximum value of the transmitting power depending on the spectrum masks. When a certain degree of distortion can be allowed in the low multiple values, each operating point of the former and later stage amplifiers is set higher and a high output power can be obtained. When much distortion amount cannot be allowed in the high multiple values, one possible method is such that a gain of the former stage amplifier is set lower and the later stage amplifier amplifies the output power to a desired value.

As described above, in the transmitter of the radio communication device, when a desired output power cannot be obtained by using one amplifier, a technique is performed in which the amplifiers are connected with multiple stages to obtain the desired output power. Further, a non-linearly correction circuit (hereinafter, referred to as a linearizer) is used to restrain a frequency component out of a band frequency that is caused by the non-linear distortion in the amplifier. As the linearizer, for example, a feed forward type linearizer is used where a feedback from the transmitting output is not used.

Documents disclosing a technique related to the amplifier and the linearizer as described above include, for example, Patent document 1, Patent Document 2.
Citation List
 Patent Literature
  Patent Document 1: Japanese Unexamined Patent Application Publication No. 6-069731
  Patent Document 2: Japanese Unexamined Patent Application Publication No. 11-239190

SUMMARY OF INVENTION

Technical Problem

In the feed forward type linearizer, which is used to restrain the non-linear distortion of the amplifier and in which the feedback from the transmitting output is not used, an inverse characteristic of the amplifier is represented with an approximation by a polynomial expression or the like. However, the polynomial expression can represent only one type of the distortion characteristic. Therefore, when the plural amplifiers connected with multiple stages are used, the linearizer can correct the distortion of only the last stage amplifier having the most dominant distortion.

As described above, when the operation points of the plural amplifiers connected with multiple stages are set to different values, the feed forward type linearizer having one type of the inverse characteristic cannot perform the correction in response to every condition. Especially, there is a problem that the distortion remains in an outputting signal when the high output power is desired.

Purpose of the Invention

The invention is made to solve the above mentioned problem and the purpose of it is to provide a power amplifier, a non-linear distortion correcting method of the power amplifier and a radio communication device in which the linearizer corresponding to each amplifier can accurately correct distortion even if the plural amplifiers are used at any operation points.

Solution to Problem

A power amplifier according to the invention is configured to include: a number of amplifiers connected with multiple stages; and a number of linearizers connected with multiple stages and correcting non-linear distortions of the amplifiers. In the power amplifier of the present invention, a distortion in the amplifier of a former stage is corrected by the linearizer of a later stage.

A non-linear distortion correcting method of a power amplifier according to the invention includes: connecting a number of amplifiers with multiple stages, the amplifiers amplifying a power, and connecting a number of linearizers with multiple stages which corrects non-linear distortions of the amplifiers. In this method, a distortion in the amplifier of a former stage is corrected by the linearizer of a later stage.

A radio communication device according to the invention includes a power amplifier including: a number of amplifiers connected with multiple stages; and a number of linearizers connected with multiple stages and correcting non-linear distortions of the amplifiers. In the radio communication device, a distortion in the amplifier of a former stage is corrected by the linearizer of a later stage.

Advantageous Effects of Invention

According to the invention, even if the plural amplifiers are used at any operation point, the distortion can be corrected accurately by the linearizer corresponding to each amplifier.

DESCRIPTION OF EMBODIMENTS

First Embodiment

Figure 1:
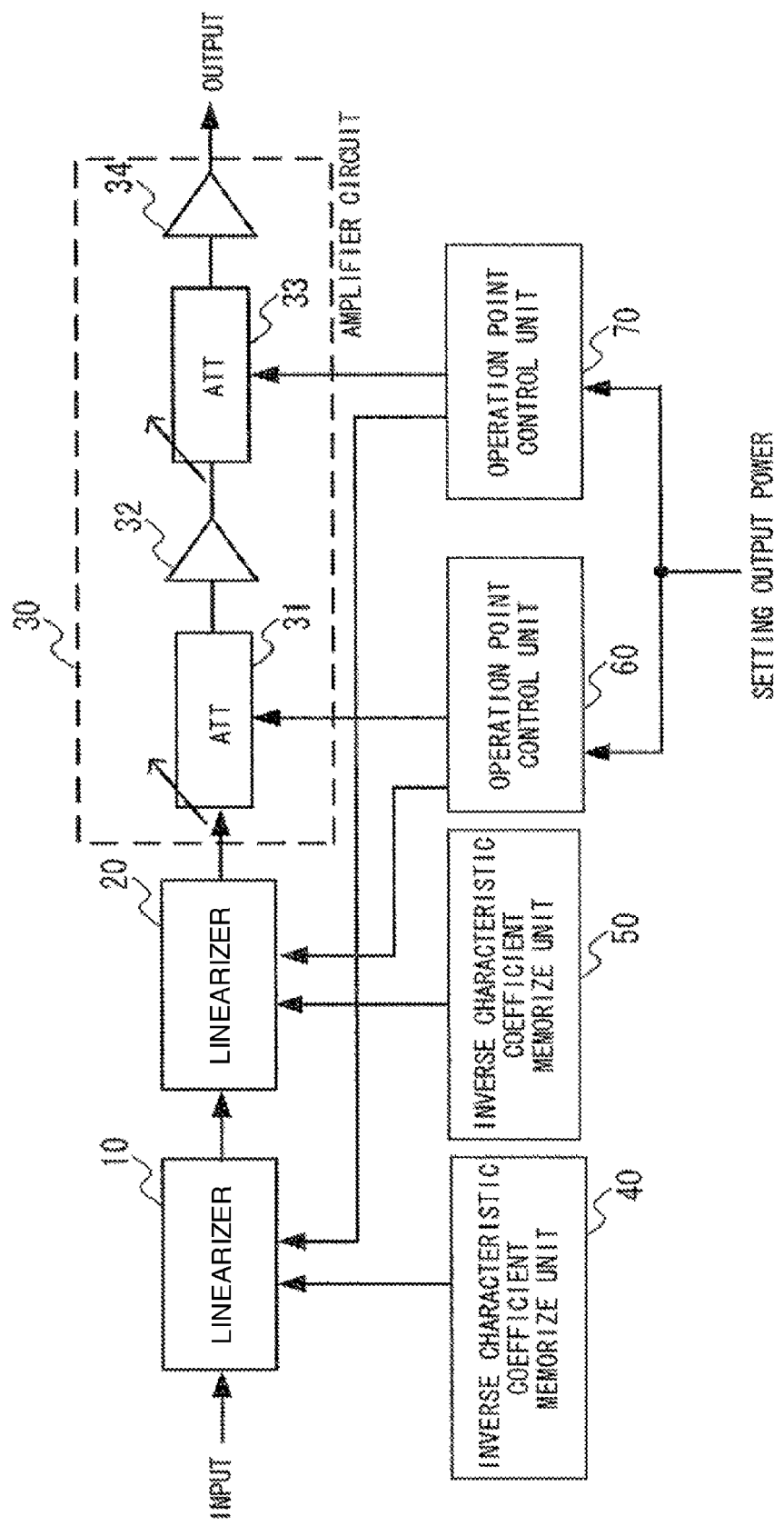
FIG. 1 is a block diagram showing a configuration example of a power amplifier according to a first embodiment of the invention.

FIG. 1 shows a configuration example of a power amplifier according to the present embodiment in the case where two amplifiers are connected which generate distortions.

The power amplifier according to the present embodiment includes linearizers 10 and 20, an amplifier circuit 30, inverse characteristic coefficient memorize units 40 and 50, and operation point control units 60 and 70.

Figure 2:
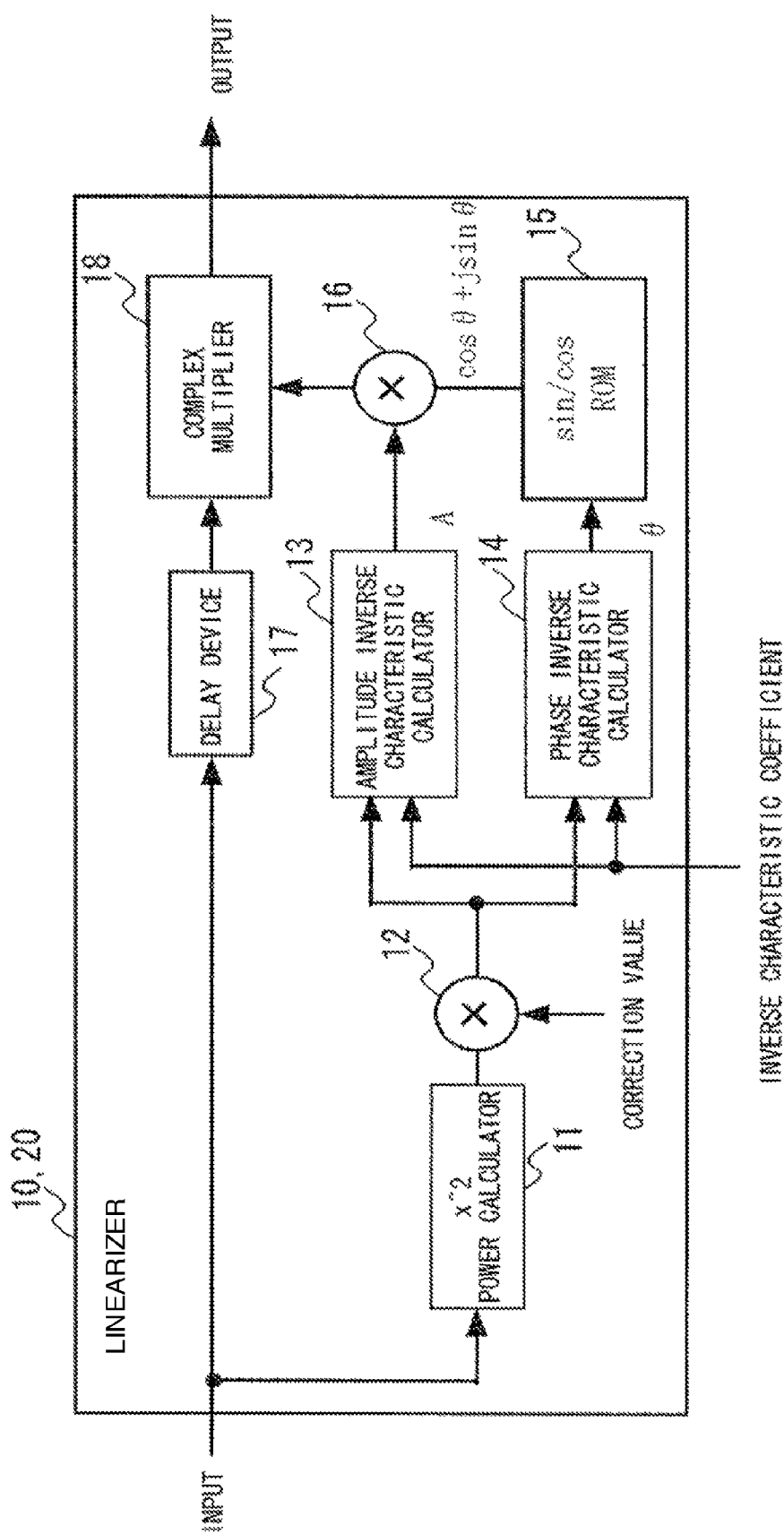
FIG. 2 is a block diagram showing a linearizer configured in the power amplifier according to the first embodiment of the invention.

The linearizers 10 and 20 are parts adding inverse characteristic of non-linear distortions occurring in amplifiers to input signals. Detailed configurations of the linearizers 10 and 20 are shown in FIG. 2. The linearizers 10 and 20 shown here have a configuration the inverse characteristic of the non-linearly characteristic is divided to an amplitude characteristic and a phase characteristic, and each characteristic is approximated using a polynomial expression.

Referring to FIG. 2, each of the linearizers 10 and 20 includes a power calculator 11, a multiplier 12, an amplitude inverse characteristic calculator 13, a phase inverse characteristic calculator 14, a ROM 15, a multiplier 16, a delay device 17 and a complex multiplier 18.

The power calculator 11 is a circuit evaluating a power of an input signal by squaring the input signal.

The multiplier 12 is a part determining a strength of the non-linearly correction. The multiplier 12 multiplies a correcting amount from the operation point control unit 60 or 70 by an output from the power calculator 11, and outputs a result to the amplitude inverse characteristic calculator 13 and the phase inverse characteristic calculator 14.

The amplitude inverse characteristic calculator 13 is a part calculating an amplitude correction value for a signal received from the multiplier 12. In the present embodiment, an example is shown in which the inverse characteristics are calculated using polynomial approximation expressions and coefficients of approximate expressions for evaluating the inverse characteristics are received from the inverse characteristic coefficient memorize units 40 and 50. The amplitude correction value calculated in the amplitude inverse characteristic calculator 13 is output to the multiplier 16.

The phase inverse characteristic calculator 14 is a part calculating a phase correction value for the signal received from the multiplier 12. In the same manner as the amplitude inverse characteristic calculator 13, the phase inverse characteristic calculator 14 receives the coefficients of approximate expressions for evaluating the inverse phase characteristics from the inverse characteristic coefficient memorize units 40 and 50. The phase correction value calculated in the phase inverse characteristic calculator 14 is input to the ROM 15.

The ROM 15 outputs a complex value $\cos \theta + j \sin \theta$ corresponding to a phase signal $\theta$ which is the phase correction value output from the phase inverse characteristic calculator 14 as a phase rotation signal. The ROM 15 is a ROM stores data in which the phase signal $\theta$ and the complex value $\cos \theta + j \sin \theta$ associated with each other. This value is used at the complex multiplier 18 to rotate a phase of the input signal by a phase $\theta$.

The multiplier 16 is a part multiplying the phase rotation signal output from the ROM 15 by the amplitude correction value output from the amplitude inverse characteristic calculator 13 to generate a signal for the complex multiplier 18 to perform a phase correcting. A calculated result by the multiplier 16 is output to the complex multiplier 18.

The delay device 17 is a part delaying a signal to be corrected by a delay generated in the units from the power calculator 11 to the multiplier 16 to adjust a correction time. Signals received by the linearizers 10 and 20 are delayed by the delay device 17 and a delayed signal is output to the complex multiplier 18.

The complex multiplier 18 is a part performing a complex multiplication between an input from the delay device 17 and an input from the multiplier 16. The complex multiplier 18 receives the signals for correcting an amplitude and a phase from the multiplier 16. Therefore, the complex multiplier 18 corrects the amplitude and the phase of the signal received from the delay device 17.

A base band signal input to the linearizer described in the present embodiment is connected to an input of the linearizer 10. An input of the linearizer 20 is connected to an output of the linearizer 10.

A variable attenuator 31 is connected to an output of the linearizer 20. The variable attenuator 31 varies a gain according to a gain adjustment signal from the operation point control unit 60 and outputs it to an amplifier 32.

The amplifier 32 is an amplifier whose gain is fixed. The amplifier 32 amplifies an output of the variable attenuator 31 and outputs it to a variable attenuator 33.

In the same manner as the variable attenuator 31, the variable attenuator 33 varies a gain according to a gain adjustment signal from the operation point control unit 70 and outputs it to an amplifier 34.

In the same manner as the amplifier 32, the amplifier 34 is an amplifier whose gain is fixed. The amplifier 34 amplifies a signal of the variable attenuator 33 and outputs it.

The inverse characteristic coefficient memorize unit 40 memorizes the coefficients of the polynomial expression representing an inverse characteristic of an input-output amplitude characteristic and an input-output phase characteristic of the amplifier 34. On the other hand, the inverse characteristic coefficient memorize unit 50 memorizes the coefficients of a polynomial expression representing an inverse characteristic of input-output amplifier and phase characteristics of the amplifier 34.

The inverse characteristic coefficient memorize unit 40 and the inverse characteristic coefficient memorize unit 50 supply memorized coefficients of the polynomial expressions to the linearizer 10 and to the linearizer 20, respectively.

The operation point control units 60 and 70 are parts setting correction amounts in the linearizers 10 and 20 and attenuation amounts in the variable attenuators 31 and 33. The operation point control units 60 and 70 have a function of adjusting a gain of the amplifier circuit 30 including the variable attenuators 31 and 33 and the amplifiers 32 and 34 to set the output power to a specified value when the output power is specified, and setting the non-linear correction value at the time in each of the linearizers 10 and 20.

The operation point control unit 60 sets the correction amount in the linearizer 20 and the attenuation amount in the variable attenuator 31 and the operation point control unit 70 sets the correction amount in the linearizer 10 and the attenuation amount in the variable attenuator 33.

Operations in the First Embodiment

Next, an operation according to the present embodiment configured as described above will be explained.

First, operations according to each of the linearizers 10 and 20 will be described. The linearizer 10 corrects a non-linear distortion in the amplifier 34 and the linearizer 20 corrects a non-linear distortion in the amplifier 32.

In this example, the coefficients of the polynomial expressions supplying the inverse characteristics of the non-linearly characteristic in each amplifier are preliminarily calculated and calculated coefficients of the polynomial expressions are set in the inverse characteristic coefficient memorize unit 40 and the inverse characteristic coefficient memorize unit 50.

The linearizer calculates an instantaneous power P of the received signal and the correction value at the time. In the present embodiment, an inverse characteristic A (P) in the amplitude and an inverse characteristic θ (P) in the phase are calculated using an approximate expression.

The correction amount is a value to adjust a difference between an operation point in the amplifier when the coefficients of the approximate expression are calculated and an operation point at the condition when the amplifier is currently used now. For example, it is assumed that the coefficients of the approximate expression are adjusted under the condition where the correction amount is set to be 1.0 and the output power of the output of amplifier is set maximum. In this case, when the output of the amplifier is used at a half of a maximum value, the non-lenearly correction can be performed in accordance with the change in the operation point of the amplifier by setting the correction amount to be a half, or 0.5.

Using the inverse characteristic A (P) in the amplitude and the inverse characteristic θ (P) in the phase by the approximate expression calculated as described above, predistortions of the amplitude and the phase are added to the input signal with a method represented by a following expression (1).

$$\begin{pmatrix} I_{out} \\ Q_{out} \end{pmatrix} = A(P) \cdot \begin{pmatrix} \cos\theta(P) & \sin\theta(P) \\ -\sin\theta(P) & \cos\theta(P) \end{pmatrix} \begin{pmatrix} I_{in} \\ Q_{in} \end{pmatrix} \quad (1)$$

Next, a value set in the variable attenuator 31 by the operation point control unit 60 will be explained.

First, for example, the coefficients memorized in the inverse characteristic coefficient memorize unit 50 are adjusted to be a value with which the distortion can be accurately corrected under the condition where the correction value is 1.0 and the attenuation amount of the variable attenuator 31 is a value setting the output of the amplifier 32 maximum. On the above condition, when the output power of the amplifier 32 is needed to be a half, the attenuation amount of the variable attenuator 31 is set to be double and the correction amount for the linearizer 20 is set to be made half, which is 0.5. Therefore, the linearizer 20 can accurately correct the non-linear distortion generated in the amplifier 32 whose output power is made a half. That is, when it is needed that the output power of the amplifier 32 is multiplied by X, the attenuation amount in the variable attenuator 31 may be multiplied to be by 1/X and the correction amount for the linearizer 20 may be multiplied by X.

In the same manner, in the linearizer 10, when it is required that the output power of the amplifier 34 is multiplied by Y, the attenuation amount of the variable attenuator 33 may be multiplied by 1/Y and the correction amount for the linearizer 10 may be multiplied by Y.

The non-linear distortion in the each of the amplifiers 32 and 34 can be corrected by connecting these two linearizers 10 and 20 in series.

The output of the amplifier 32 may have the same amplitude or phase characteristic as the linearizer 10 by the non-linearly correction in the linearizer 20. That is, a condition in which the distortion of the amplifier 32 is corrected can be obtained.

Because the output of the linearizer 10 performs the non-linearly correction for the amplifier 34, the output of the amplitude 32 which is equivalent to it is input to the amplifier 34 through the variable attenuator 33, thereby correcting the non-linear distortion in the output of the amplifier 34.

Advantages According to the First Embodiment

According to the present embodiment, the non-linearly correction in accordance with each of the amplifiers 32 and 34 is performed. Therefore, even if the plural amplifiers are used at any operation point, the distortions can be corrected correctly by the linearizer corresponding to each amplifier. Therefore, even in the case where it has no other choice in the past but to set the transmission power is set to be low because of large non-linear distortion, high power can be used, thereby enabling to use the ability of the amplifiers efficiently and contributing to an increase in a device performance.

EXAMPLES

In a radio communication device capable of using plural modulation methods, there are some cases in which each modulation method has different standards of spectrum masks of a transmitting output. The following case are possible: a case in which a restriction of the spectrum mask is loose and the output power can be set higher; and a case in which the spectrum mask is restricted and the output power cannot be set so higher and so on. Therefore, a level diagram in an inner amplifier is changed according to the conditions so that the amplifier is used at an optimal condition.

In the example, as an example, assuming a case where the amplifiers are connected with two stages as shown in FIG. 1 and the variable attenuator 33 placed at the input of the second stage amplifier 34 controls the transmitting power, an explanation will be given.

Figure 3A:
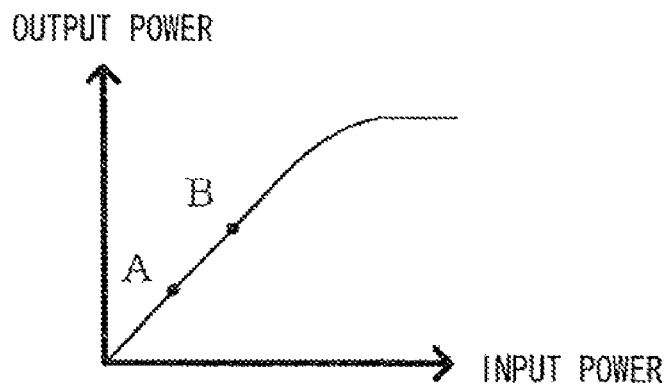
FIG. 3A is a diagram explaining an input-output characteristic of each amplifier of the power amplifier according to the first embodiment of the invention.
Figure 3B:
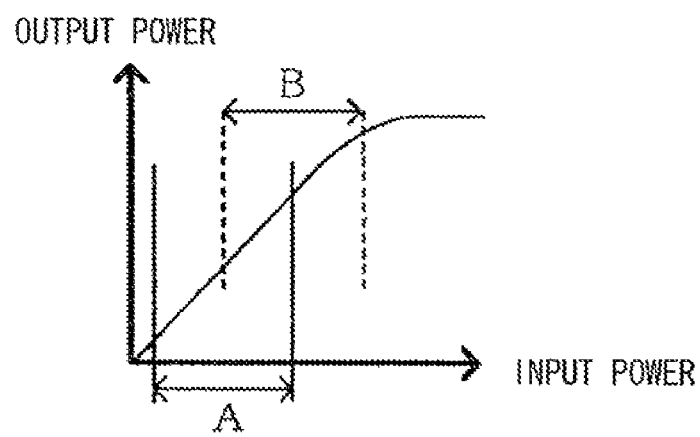
FIG. 3B is a diagram explaining an input-output characteristic of each amplifier of the power amplifier according to the first embodiment of the invention.

Each input-output characteristic of the amplifiers 32 and 34 will be shown in FIG. 3A and FIG. 3B. FIG. 3A shows an input-output characteristic of the first stage amplifier 32 and FIG. 3B shows an input-output characteristic of the second stage amplifier 34.

When a restriction of the spectrum mask is strict and much distortion in the amplifier 30 cannot be allowed, the operation point of the first stage amplifier 32 is set to be a point A in FIG. 3A. In this case, a variable range of the variable attenuator 33 is reflected and the operation point of the second stage amplifier 34 is set in a range of A in FIG. 3B.

In this case, the output power becomes lower but the non-linear distortion generated in the first stage becomes smaller and only the non-linear distortion of the second stage amplifier 34 becomes dominant. Therefore, even a feed forward type linearizer according to the related art can adequately correct the distortion.

On the other hand, in the case where the restriction of the spectrum mask is loose and the transmitting power needs to be increased even if it causes some distortion, the operation point of the first stage amplifier 32 is set to be a point B in FIG. 3A. At this time, the operation point of the second stage amplifier 34 is set to be a range B in FIG. 3B. In this case, the output power becomes large but a non-linear distortion that is generated becomes larger as well. Further, a certain level of non-linear distortion also arises in the first stage amplifier 32 as well.

Figure 4A:
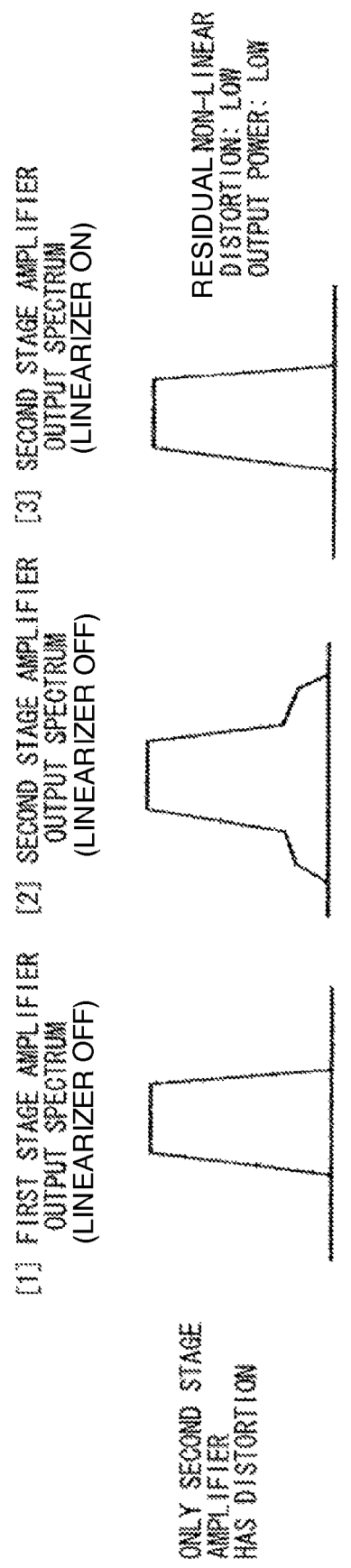
FIG. 4A is a diagram showing conditions of output spectra of an amplifier according to an example of the invention.
Figure 4B:
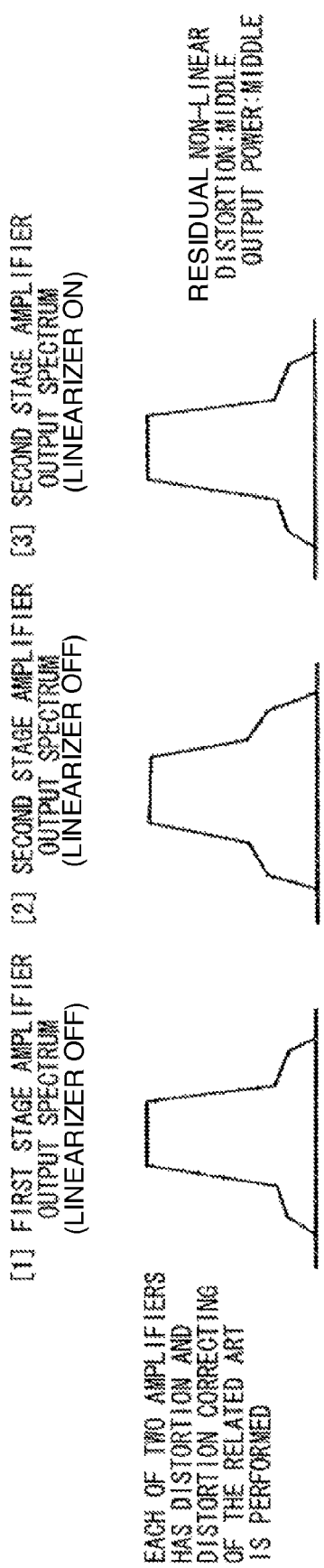
FIG. 4B is a diagram showing conditions of output spectra of an amplifier according to an example of the invention.
Figure 4C:
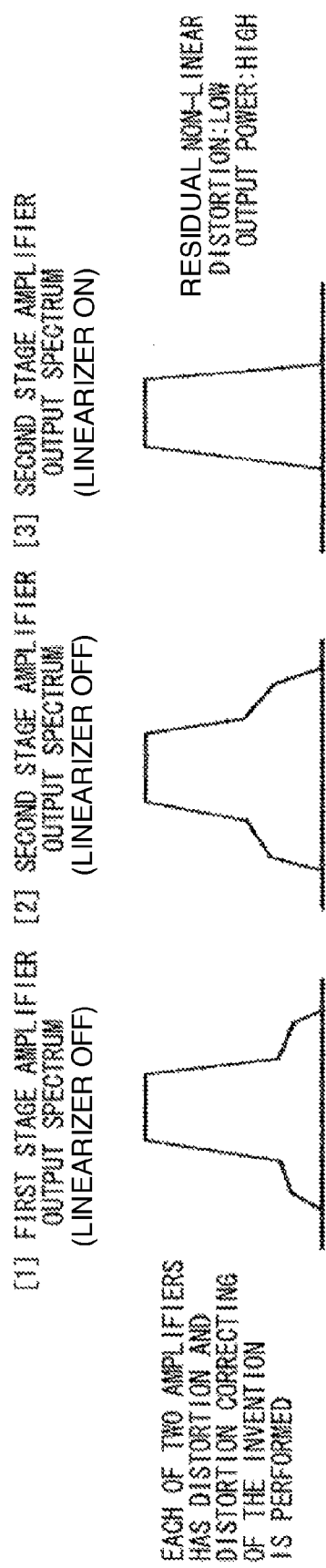
FIG. 4C is a diagram showing conditions of output spectra of an amplifier according to an example of the invention.

FIGS. 4A to 4C show above-stated conditions with spectrum conditions. In FIGS. 4A to 4C, starting from the left, spectra in an output of the first stage amplifier 32 (the linearizer is Off), an output of the second stage amplifier 34 (the linearizer is Off), and an output of the second stage amplifier 34 (the linearizer is On) are shown.

FIG. 4A shows a condition in which the distortion arises only in the second stage amplifier 34 and the linearizer according to the related art is adapted to the second stage amplifier 34. FIG. 4B shows a condition in which the distortion arises in each of two amplifiers 32 and 34 and the linearizer according to the related art is adapted to the second stage amplifier 34. FIG. 4C shows a condition in which each of two amplifiers 32 and 34 has the distortion and the linearizers according to the present embodiment are adapted.

As shown in FIG. 4A, in the condition in which the distortion arises only in the second stage amplifier 34, even the linearizer according to the related art can suppress the non-linear distortion by giving the coefficients adjusted to the amplifier 34 to the characteristic of the linearizer. In the case in which the linearizer according to the related art is used and the restraining of the spectra mask is strict, such a method is used. However, in the case, the output power cannot be set so large.

As shown in FIG. 4B, in a case where the restraining of the spectrum mask is comparatively loose, a method is set in which the operation point of the first stage amplifier 32 is set to be a certain high level and the second stage amplifier 34 further amplifies it. However, in this case, because the linearizer according to the related art is adapted to the characteristic of the amplifier 34, a correcting is not performed on the first stage amplifier 32. Therefore, the distortion generated in the first stage amplifier 32 remains in a final output spectrum.

In this way, when the linearizer according to the related art having a single type of inverse characteristic is adapted to the amplifier designed to set the operation points of each amplifier separately, it has no other choice but to set the coefficients of the linearizer so as to cancel the non-linear distortion of the most dominant amplifier in distortion (usually, that is the last stage amplifier). However, the non-linear distortions of the other amplifiers remain uncorrected.

In such a case, when the linearizers corresponding to each amplifier are connected in series and separate correction amount is set to each linearizer as in the present embodiment, the distortion correcting corresponding to each amplifier is available.

In FIG. 4C, each of the amplifiers 32 and 34 is used under a condition where each of the amplifiers 32 and 34 generates the distortion. However, because the distortion arising in the amplifier 32 is corrected by the linearizer 20 and the distortion arising in the amplifier 34 is corrected by the linearizer 10, the output power can be larger while correcting the non-linear distortion. That is, a distortion correcting of the former stage amplifier 32 is performed by the later linearizer 20 and the distortion correcting of the later stage amplifier 34 is performed by the former linearizer 10. This can be explained as follows.

It is assumed that a transfer function of the former stage amplifier 32 is $aG1(x)$, a transfer function of the linearizer 20 correcting this is $G1'(x)$, a transfer function of the second stage amplifier 34 is $bG2(x)$ and a transfer function of the linearizer 10 correcting this is $G2'(x)$. Note, "a" represents a gain of the amplifier 32, "b" represents a gain of the amplifier 34 and "x" represents an input signal. Further, it is assumed that inverse characteristics G1' and G2' of the linearizers completely correct the non-linear distortions of the amplifiers and expressions $aG1(G1'(x))=ax$ and $bG2(aG2'(x))=abx$ are satisfied.

A signal in each part will be shown.
The output of the first stage linearizer 10: $G2'(x)$
The output of the second stage linearizer 20: $G1'(G2'(x))$
The output of the first stage amplifier 32: $aG1(G1'(G2'(x)))=aG2'(x)$ The output of the second stage amplifier 34: $bG2(aG2'(x))=abx$ As described above, because the later stage linearizer 20 corrects the non-linear distortion of the former stage amplifier 32, the non-linear distortion of each amplifier can be corrected by separate linearizers. Here, an essential point is that the output of the first stage amplifier 32 is a signal including the correction of the amplifier 34 generated in the linearizer 10.

If the former stage linearizer 10 performs the non-linearly correction of the former stage amplifier 32, the non-linearly correction cannot be realized as shown in following formulas.
The output of the first stage linearizer 10: $G1'(x)$
The output of the second stage linearizer 20: $G2'(G1'(x))$
The output of the first stage amplifier 32: $aG1(G2'(G1'(x)))$
The output of the second stage amplifier 34: $bG2(aG1(G2'(G1'(x))))$ The above example leads to the following the understanding. It is designed that the distortion in an amplifier of a former stage is corrected by a linearizer of a later stage and the non-linearly correction is performed according to an amplifier in each stage. Therefore, even when the plural amplifiers are used at any operation point, the linearizer corresponding to each amplifier can correct the distortion correctly.

In the above mentioned embodiment, the non-linear distortion correcting of the linearizer in the case where two amplifiers 32 and 34 are connected in series is described. However, the present invention can be applied to the case where three or more amplifiers are connected in series.

Figure 5:
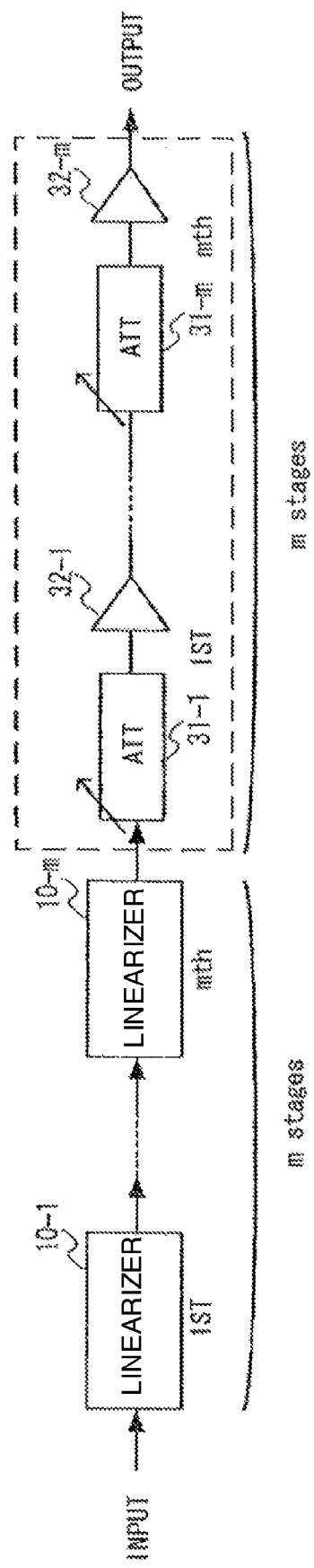
FIG. 5 is a block diagram showing a configuration example of a power amplifier according to other embodiment of the invention.

FIG. 5 shows a configuration example in other embodiment where m amplifiers are connected in series (m is an integer number of three or more). The principle is the same as that in the first embodiment shown in FIG. 1 and the linearizer performing the non-linearly distortion correction for a former stage amplifier is located at a later stage.

That is, (m−n+1)-th stage linearizer corrects an amplifier 32-n which is an n-th stage amplifier. Note, m is equal to or more than n. As described above, because the output of the former stage amplifier includes a non-linearly correction component of the later stage amplifier, a pre-distortion for the former stage amplifier needs to be performed to include the correction component of the later stage amplifier.

The invention has been described taking preferable exemplary embodiments and the example as described above. However, the invention is not necessary limited to the above mentioned embodiments and the example, but may be modified in various ways without departing from the technical spirit of the invention.

INDUSTRIAL APPLICABILITY

The present invention is applicable to a power amplifier amplifying a transmitting signal in a transmitting unit of a radio communication device, and more especially to a power amplifier, a non-linear distortion method of the power amplifier and a radio communication device having a function correcting a non-linear distortion in the amplifier.

REFERENCE SIGNS LIST 10, 20: LINEARIZER
11: POWER CALCULATOR
12: MULTIPLIER
13: AMPLITUDE INVERSE CHARACTERISTIC CALCULATOR
14: PHASE INVERSE CHARACTERISTIC CALCULATOR
15: ROM
16: MULTIPLIER
17: DELAY DEVICE
18: COMPLEX MULTIPLIER
30: AMPLIFIER CIRCUIT
31, 33: VARIABLE ATTENUATOR
32, 34: AMPLIFIER
40, 50: INVERSE CHARACTERISTIC COEFFICIENT MEMORIZE UNIT
60, 70: OPERATION POINT CONTROL UNIT

The invention claimed is:

1. A power amplifier comprising:
a plurality of amplifiers connected with multiple stages;
a plurality of linearizers connected with multiple stages and correcting non-linear distortions of the amplifiers; and
a plurality of operation point control units setting a correction amount to each of the plurality of linearizers,
wherein a distortion in the amplifier of a former stage is corrected by the linearizer of a later stage.

2. The power amplifier according to claim 1, wherein the power amplifier is configured to be applied to any level diagram by adjusting a correction amount of each of the linearizers to an operation point of each of the amplifiers.

3. The power amplifier according to claim 1, comprising a plurality of variable attenuators each of which connected to a former stage of each of plurality of the amplifiers,
wherein the variable attenuators vary gains according to attenuation amounts set by the plurality of operation point control units and output the gains to the amplifiers.

4. The power amplifier according to claim 1, wherein each of the linearizers comprises a configuration in which an inverse characteristic of the non-linear distortion is divided to an amplitude characteristic and a phase characteristic and each of the characteristics is approximated by a polynomial expression.

5. The power amplifier according to claim 1, comprising a plurality of inverse characteristic coefficient memorize units memorizing coefficients of the polynomial expressions representing the inverse characteristic of an input-output characteristic amplitude and an input-output phase characteristic of the amplifier, the coefficients being supplied to plurality of the linearizers.

6. The power amplifier according to claim 1, wherein the plurality of amplifiers are amplifiers whose gains are fixed.

7. The power amplifier according to claim 4, wherein each of the linearizers includes:
a power calculator calculating a power of an input signal;
a first multiplexer performing multiplication between a correction amount from the operation point control unit and an output of the power calculation unit and calculating a strength of a non-linearly correction;
an amplitude inverse characteristic calculator calculating an amplitude correction value for a signal from the first multiplexer according to the coefficients from the inverse characteristic coefficient memorize unit;
a phase inverse characteristic calculator calculating a phase correction value for the signal from the first multiplexer according to the coefficients from the inverse characteristic coefficient memorize unit;
a memory unit memorizing a phase rotation signal as a complex number corresponding to the phase correction value output from the phase characteristic calculator;
a second multiplexer performing a multiplication between the phase rotation signal from the memory unit and the amplitude correction value; and
a complex multiplexer performing complex multiplication between the input signal and an output from the second multiplexer and correcting a phase and an amplitude of the input signal.

8. A radio communication device comprising a power amplifier, the power amplifier according to claim 1.

9. A non-linear distortion correcting method of a power amplifier comprising:
connecting a plurality of amplifiers with multiple stages, the amplifiers amplifying a power;
connecting a plurality of linearizers with multiple stages, the linearizers correcting non-linear distortions of the amplifiers; and
setting a correction amount for each of the plurality of linearizers by each of a plurality of operation point control units,
wherein a distortion in the amplifier of a former stage is corrected by the linearizer of a later stage.

10. The non-linear distortion correcting method of a power amplifier according to claim 9, comprising designing the power amplifier to be applied to any level diagram by adjusting a correction amount of each of the linearizers to an operation point of each of the amplifiers.

11. The non-linear distortion correcting method of a power amplifier according to claim 9, comprising connecting each of a plurality of variable attenuators to a former stage of each of the plurality of amplifiers,
wherein the variable attenuators vary gains according to attenuation amounts set by the plurality of operation point control units and output to the gains the amplifiers.

12. The non-linear distortion correcting method of a power amplifier according to claim 9, wherein each of the linearizers divides an inverse characteristic in the non-linear distortion to an amplifier characteristic and a phase characteristic and performs a correction by approximating each characteristic by a polynomial expression.

13. The non-linear distortion correcting method of a power amplifier according to claim 9, wherein a plurality of inverse characteristic coefficient memorize units supply coefficients of the polynomial expressions representing the inverse characteristic of an input-output amplitude characteristic and an input-output phase characteristic of the amplifier, the coefficients being supplied to the plurality of the linearizers.

14. The non-linear distortion correcting method of a power amplifier according to claim 9, wherein the plurality of amplifiers are amplifiers whose gains are fixed.

* * * * *